United States Patent
Zhu et al.

(10) Patent No.: US 12,104,804 B2
(45) Date of Patent: Oct. 1, 2024

(54) VENTILATION WALL SYSTEM AND DATA CENTER

(71) Applicant: Huawei Digital Power Technologies Co., Ltd., Shenzhen (CN)

(72) Inventors: Qian Zhu, Xi'an (CN); Yonghuang Tong, Dongguan (CN); Qingfei Song, Xi'an (CN)

(73) Assignee: HUAWEI DIGITAL POWER TECHNOLOGIES CO., LTD., Shenzhen (CN)

( * ) Notice: Subject to any disclaimer, the term of this patent is extended or adjusted under 35 U.S.C. 154(b) by 164 days.

(21) Appl. No.: 17/584,948

(22) Filed: Jan. 26, 2022

(65) Prior Publication Data

US 2022/0240420 A1 Jul. 28, 2022

(30) Foreign Application Priority Data

Jan. 27, 2021 (CN) .......................... 202120234768.0

(51) Int. Cl.
*F24F 1/00* (2019.01)
*H05K 7/20* (2006.01)

(52) U.S. Cl.
CPC ............ *F24F 1/00* (2013.01); *H05K 7/20745* (2013.01); *H05K 7/20836* (2013.01)

(58) Field of Classification Search
CPC .... H05K 7/20745; H05K 7/20836; F24F 1/00
USPC ....................................................... 454/184
See application file for complete search history.

(56) References Cited

U.S. PATENT DOCUMENTS

| | | | | |
|---|---|---|---|---|
| 6,370,899 B1* | 4/2002 | Hobbs | ..................... | F24F 13/20 |
| | | | | 62/298 |
| 6,374,627 B1* | 4/2002 | Schumacher | ............. | G06F 1/20 |
| | | | | 62/263 |
| 7,249,466 B2* | 7/2007 | Park | ..................... | F24F 1/0057 |
| | | | | 62/298 |
| 7,841,199 B2* | 11/2010 | VanGilder | ................. | G06F 1/20 |
| | | | | 62/407 |
| 7,867,070 B2* | 1/2011 | Day | ................... | H05K 7/20754 |
| | | | | 454/184 |

(Continued)

FOREIGN PATENT DOCUMENTS

| | | |
|---|---|---|
| CN | 207340389 U | 5/2018 |
| CN | 207831549 U | 9/2018 |
| CN | 305474154 S | 12/2019 |

*Primary Examiner* — Avinash A Savani
*Assistant Examiner* — Dana K Tighe
(74) *Attorney, Agent, or Firm* — WOMBLE BOND DICKINSON (US) LLP

(57) ABSTRACT

A ventilation wall system has an air intake end for air entering and an air exhaust end for air exhausting. The ventilation wall system includes a heat exchanger module, a fan module, an electric control module, and an air filter module. The heat exchanger module is configured to exchange heat for air entering the heat exchanger module. The fan module is configured to convey air on one side of the fan module to the other side of the fan module. The electric control module is electrically connected to the fan module and the heat exchanger module. The air filter module is configured to filter air entering the air intake end. When the fan module is disposed on a side that is of the heat exchanger module and that is close to the air exhaust end, air after heat exchange performed by the heat exchanger module is sent out.

19 Claims, 4 Drawing Sheets

(56) References Cited

U.S. PATENT DOCUMENTS

| | | | | |
|---|---|---|---|---|
| 8,336,672 B2* | 12/2012 | Derks | ............... | F16L 55/0336 |
| | | | | 454/262 |
| 8,537,536 B1* | 9/2013 | Rembach | ............ | H05K 7/1497 |
| | | | | 361/679.48 |
| 8,540,557 B1* | 9/2013 | Derks | ............... | F24F 13/0227 |
| | | | | 454/184 |
| 9,145,677 B2* | 9/2015 | Wang | ...................... | G08B 5/36 |
| 10,292,305 B2* | 5/2019 | Greubel | .................. | F24F 8/10 |
| 2009/0210096 A1* | 8/2009 | Stack | ...................... | F24F 11/76 |
| | | | | 700/278 |

* cited by examiner

VENTILATION WALL SYSTEM AND DATA CENTER

CROSS-REFERENCE TO RELATED APPLICATIONS

This application claims priority to Chinese Patent Application No. 202120234768.0, filed on Jan. 27, 2021, which is hereby incorporated by reference in its entirety.

TECHNICAL FIELD

This application relates to the heat dissipation field, and in particular, to a ventilation wall system and a data center.

BACKGROUND

Currently, with continuous advancement of digitalization, high-density processing places such as data centers keep increasing, and heat dissipation and cooling need to be continuously performed on the high-density processing places. This raises a higher requirement on a cooling capacity of an air conditioner. A conventional room-level air conditioner sends cold air to a data center in an overhead air distribution mode or an underfloor air distribution mode. In this way, an air duct or a raised floor needs to be designed, and a design scheme is complex. In addition, a large floor area is occupied, and installation of an entire system takes a long time. However, most existing data centers with ventilation wall air conditioners use larger heat exchangers and fans to improve cooling capacities of the air conditioners, and use a small-granularity form of a small heat exchanger with a single fan or a large-granularity form of a large heat exchanger with fans in structure. The small-granularity form may achieve different cooling capacities through arrangement and combination of modules. However, a single cooling mode cannot meet requirements of different application scenarios. The large-granularity form occupies a large space. In addition, an installation mode is basically a conventional assembly mode in which key cooling components are arranged in a cabinet. Therefore, a cooling mode is difficult to change.

SUMMARY

In view of this, a ventilation wall system and a data center need to be provided, to effectively improve adaptability of the ventilation wall system.

According to a first aspect of embodiments of this application, a ventilation wall system is provided. The ventilation wall system has an air intake end for air entering and an air exhaust end for air exhausting. The ventilation wall system includes a heat exchanger module, a fan module, an electric control module, and an air filter module. The heat exchanger module is configured to exchange heat for air entering the heat exchanger module. The fan module is configured to convey air on one side of the fan module to the other side of the fan module. The electric control module is electrically connected to the fan module and the heat exchanger module. The air filter module is configured to filter air entering the air intake end. When the fan module is disposed on a side that is of the heat exchanger module and that is close to the air exhaust end, air after heat exchange performed by the heat exchanger module is sent out by using the fan module. When the fan module is disposed on a side that is of the heat exchanger module and that is close to the air intake end, air is conveyed, by using the fan module, to the heat exchanger module for heat exchange.

In the ventilation wall system, modular processing is performed on the fan module, the heat exchanger module, the electric control module, and the air filter module, to facilitate production. Only connection, fastening, and wiring are needed for assembly, so that installation is convenient, and efficiency is improved. During assembly, a module installation sequence may be adjusted based on different requirements, to switch between an air supply mode and an air suction mode, thereby quickly implementing adjustment, and improving adaptability of the ventilation wall system. Modular setting enables any module to be quickly replaced and maintained.

In a possible embodiment of the first aspect, the fan module includes a fan rack and a fan, an accommodating cavity is disposed on the fan rack, the fan is disposed in the accommodating cavity, and the fan is configured to suck air from one side of the accommodating cavity and exhaust the air from the other side of the accommodating cavity. The fan rack including the accommodating cavity is disposed, and the fan is disposed in the accommodating cavity, to facilitate the fan in driving air, thereby improving efficiency of the ventilation wall system.

In a possible embodiment of the first aspect, the fan rack includes a first support bar, a second support bar, a third support bar, and a spacer plate. The first support bar, the second support bar, and the third support bar are disposed perpendicular to each other, and a plurality of spaces are separated on the fan rack. The spacer plate is separately connected to the first support bar and the second support bar, or the second support bar and the third support bar, to isolate the plurality of separated spaces from each other to form the accommodating cavity. The first support bar, the second support bar, the third support bar, and the spacer plate are disposed to separate a plurality of accommodating cavities on the fan rack, so that fans may respectively exchange air for different accommodating cavities, thereby facilitating maintenance on one fan or accommodating cavity separately.

In a possible embodiment of the first aspect, the fan rack further includes an air deflector, the air deflector is disposed on the first support bar and the third support bar, and the air deflector is configured to guide a flow direction of air, so that air is sucked from one side of the accommodating cavity and exhausted from the other side of the accommodating cavity. The air deflector is disposed to enhance air diversion performed by the fan module.

In a possible embodiment of the first aspect, the air deflector includes a front air deflector and a rear air deflector, and the front air deflector and the rear air deflector are disposed on two sides of the accommodating cavity. An air intake vent relative to the fan is disposed in a middle part of the front air deflector, and air exhaust vents are disposed on the rear air deflector. The front and rear air deflectors are disposed to improve working efficiency of the fan.

In a possible embodiment of the first aspect, the fan is a centrifugal fan, and the air exhaust vents are disposed along a circumferential direction of the rear air deflector. The air exhaust vents disposed along the circumferential direction help homogenize air blown out by the centrifugal fan, so that the exhausted air is soft.

In a possible embodiment of the first aspect, the fan module further includes a mounting base, the mounting base is disposed in the accommodating cavity, and the fan is disposed in the accommodating cavity by using the mounting base. The mounting base is disposed to facilitate setting of a specific position of the fan as required.

In a possible embodiment of the first aspect, the fan rack further includes a reinforcing structure. The reinforcing structure is configured to reinforce a connection, to prevent the connection of the fan rack from being loosened or deformed due to vibration or the like during operation of the fan, causing the fan module to break up.

In a possible embodiment of the first aspect, the heat exchanger module includes a heat exchanger frame, a heat exchanger, and a pipeline, and the heat exchanger frame is configured to place the heat exchanger and configure the pipeline connected to the heat exchanger.

In a possible embodiment of the first aspect, the heat exchanger module further includes a humidifier and a water pan. The humidifier is configured to: when indoor relative humidity is relatively low, humidify dry hot air entering the heat exchanger module.

In a possible embodiment of the first aspect, the electric control module includes a mounting rack and an electric control box, the mounting rack is disposed on the heat exchanger frame, the electric control box is disposed on the mounting rack, and the electric control box is electrically connected to the fan module and the heat exchanger separately. The mounting rack is disposed to facilitate the electric control module in adjusting, based on a structure of the heat exchanger module, a position at which the electric control module is disposed.

In a possible embodiment of the first aspect, the ventilation wall system further includes a connecting mechanism, and the connecting mechanism is configured to connect the fan module, the heat exchanger module, the electric control module, and the air filter module.

In a possible embodiment of the first aspect, the connecting mechanism includes a corner piece and a bolt, the electric control module is disposed on the heat exchanger module by using the bolt, the corner piece is disposed on the fan module and the heat exchanger module, and the fan module and the heat exchanger module are connected to each other by using the corner piece.

In a possible embodiment of the first aspect, the ventilation wall system further includes a flow equalizing frame, and the flow equalizing frame is disposed between the fan module and the heat exchanger module to increase a distance at which air is conveyed to the heat exchanger module by using the fan module. The flow equalizing frame may equalize a flow of air, so that air entering the heat exchanger module through the fan module remains relatively even.

According to a second aspect of the embodiments of this application, a data center is provided, including the ventilation wall system according to any one of the first aspect and the possible embodiments of the first aspect.

DESCRIPTION OF EMBODIMENTS

The following describes technical solutions in the embodiments of this application with reference to accompanying drawings in the embodiments of this application.

The following terms "first" and "second" are merely intended for a purpose of description, and shall not be understood as an indication or implication of relative importance or implicit indication of a quantity of indicated technical features. Therefore, a feature limited by "first" or "second" may explicitly or implicitly include one or more features. In description of this application, unless otherwise stated, "a plurality of" means two or more than two. Orientation terms such as "up", "down", "left", and "right" are defined relative to an orientation of schematic placement of components in the accompanying drawings. It should be understood that these directional terms are relative concepts and are used for relative description and clarification. These directional terms may vary accordingly depending on an orientation in which the components are placed in the accompanying drawings.

In this application, unless otherwise expressly specified and limited, the term "connection" should be understood in a broad sense. For example, "connection" may be a fixed connection, a detachable connection or an integral connection; and may be a direct connection or an indirect connection by using an intermediate medium. The term "and/or" used in this specification includes any and all combinations of one or more related listed items.

When the following embodiments are described in detail with reference to schematic diagrams, for ease of description, a diagram indicating a partial structure of a component is partially enlarged not based on a general scale. In addition, the schematic diagrams are merely examples, and should not limit the protection scope of this application herein.

Figure 1:
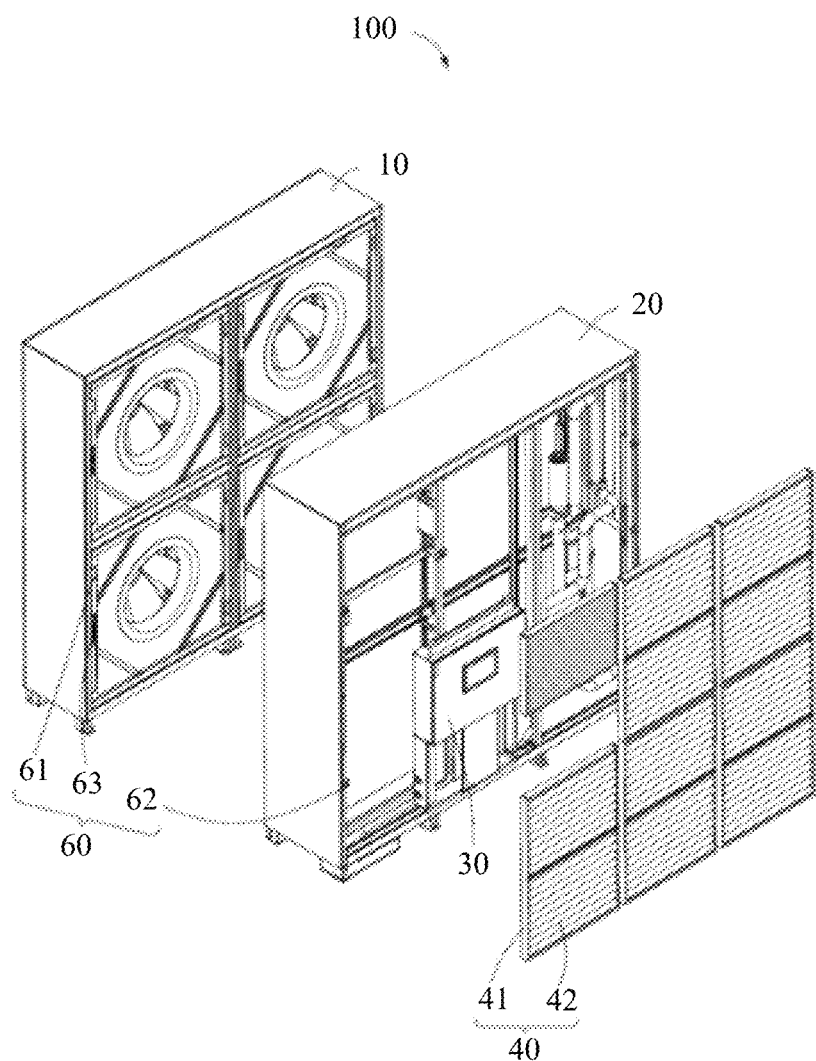
FIG. 1 is a schematic diagram of an air supply mode of a ventilation wall system according to an embodiment of this application.

FIG. 1 shows a ventilation wall system 100 provided in an embodiment of this application. The ventilation wall system 100 has an air intake end for air entering and an air exhaust end for air exhausting. The ventilation wall system 100 can perform heat exchange and cooling for a place requiring a large cooling capacity, such as a data center. Based on different places, an installation sequence of the ventilation wall system 100 may be adjusted to switch between an air supply mode in which cold air is exhausted from the ventilation wall system 100 and an air suction mode in which hot air is sucked from a place into the ventilation wall system 100, to meet requirements of different places.

The ventilation wall system 100 includes a fan module 10, a heat exchanger module 20, an electric control module 30, and an air filter module 40. The air intake end and the air exhaust end of the ventilation wall system 100 are located in a same horizontal plane. The fan module 10 and the heat exchanger module 20 are disposed adjacent to each other in a horizontal direction. A fan is disposed on the fan module 10, and can convey air on one side of the fan module 10 to the other side of the fan module 10. A heat exchanger is disposed on the heat exchanger module 20, and can exchange heat for hot air entering the heat exchanger module 20, so that the hot air is changed into cold air, and the cold air is exhausted from the other side. The electric control module 30 is electrically connected to the fan module 10 and the heat exchanger module 20, and is configured to control power and working statuses of the fan module 10 and the heat exchanger module 20, to maintain normal operation of the ventilation wall system 100. An air filter for filtering air is disposed on the air filter module 40, and is configured to filter air entering the ventilation wall system 100, to prevent dust and other impurities from entering the ventilation wall system 100 and causing damage to the ventilation wall system 100.

Figure 2:
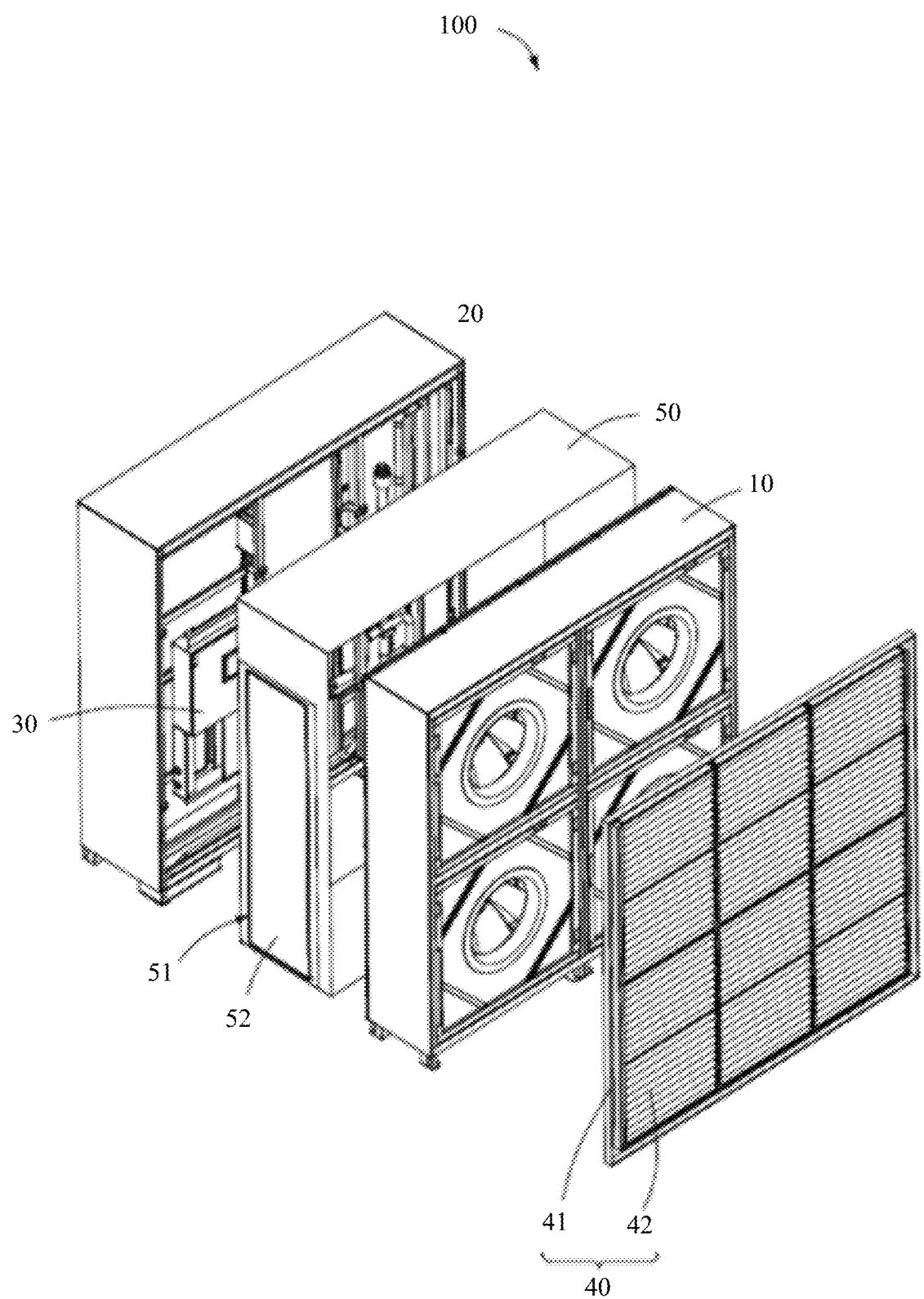
FIG. 2 is a schematic diagram of an air suction mode of a ventilation wall system according to an embodiment of this application.

Refer to FIG. 1 and FIG. 2. An installation sequence of modules such as the fan module 10, the heat exchanger module 20, the electric control module 30, and the air filter module 40 may be adjusted to quickly switch between the air supply mode and the air suction mode. As shown in FIG. 1, when the ventilation wall system 100 is in the air supply mode, an installation sequence from the air intake end to the air exhaust end is: the air filter module 40, the heat exchanger module 20, and the fan module 10. After heat exchange is performed on hot air in a place by the heat exchanger module 20, cold air is sent out from the other side of the heat exchanger module 20 and enters the fan module 10, and the fan module 10 blows the cold air sent by the heat exchanger module 20 out of the ventilation wall system 100. As shown in FIG. 2, when the ventilation wall system 100 is in the air suction mode, the installation sequence from the air intake end to the air exhaust end is: the air filter module 40, the fan module 10, and the heat exchanger module 20. Hot air in a place may be sucked into the ventilation wall system 100 by using the fan module 10, sent to the heat exchanger module 20 for heat exchange, and then sent out of the ventilation wall system 100 from the other side of the heat exchanger module 20.

Figure 3:
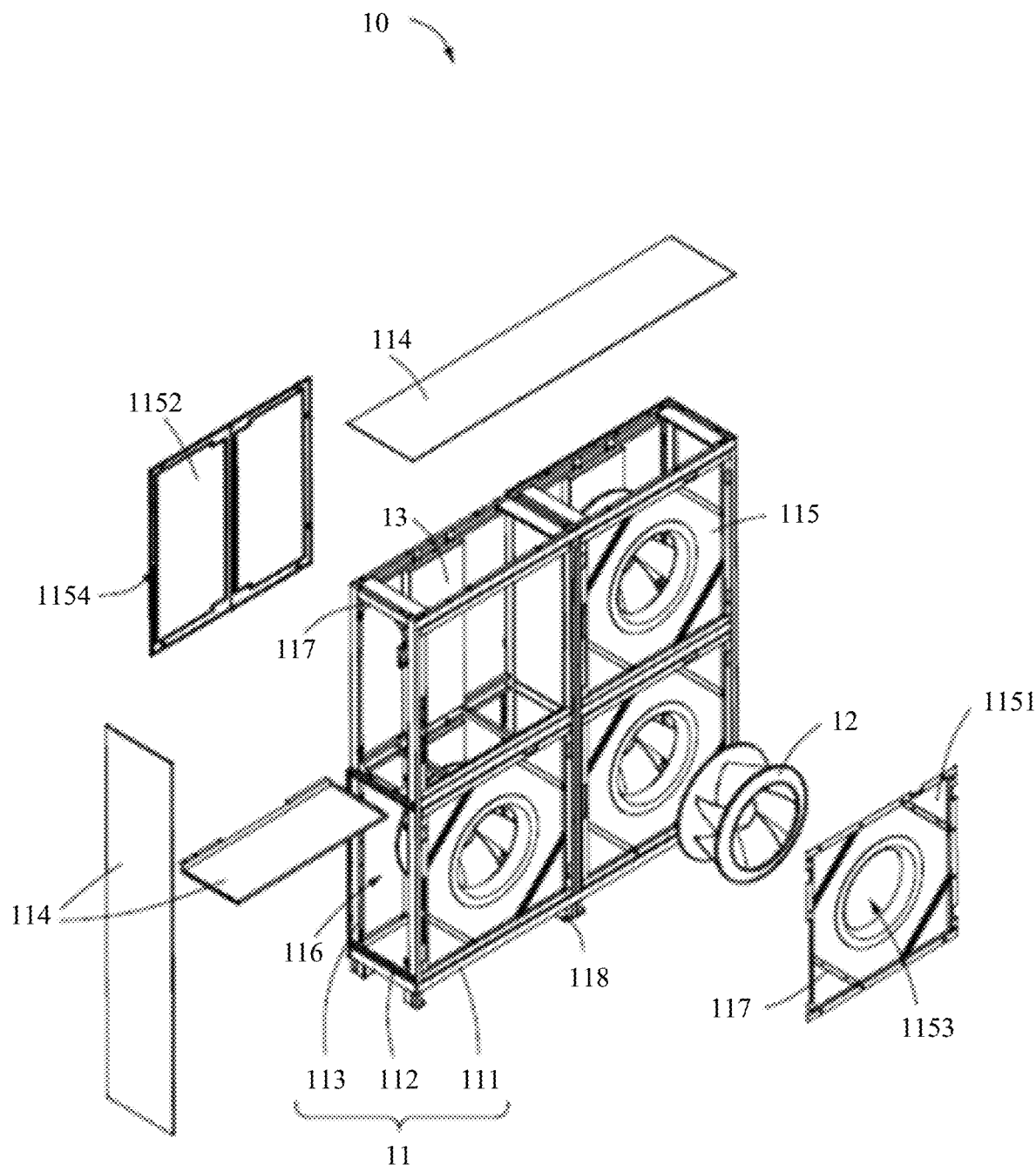
FIG. 3 is a schematic partially exploded view of a fan module of the ventilation wall system shown in FIG. 1.

Refer to FIG. 3. The fan module 10 includes a fan rack 11 and a fan 12 disposed on the fan rack 11. The fan rack 11 includes a plurality of first support bars 111, second support bars 112, third support bars 113, spacer plates 114, and air deflectors 115. The first support bar 111, the second support bar 112, and the third support bar 113 are disposed perpendicular to each other, and a plurality of spaces are separated on the fan rack 11. The spacer plate 114 is separately connected to the first support bar 111 and the second support bar 112, or the second support bar 112 and the third support bar 113, to isolate the plurality of separated spaces from each other to form an accommodating cavity 116 used to install the fan 12. The fan 12 is disposed in the accommodating cavity 116. The fan 12 is configured to suck air into the accommodating cavity 116 from one side of the accommodating cavity 116 and exhaust the air from the other side of the accommodating cavity 116. The air deflector 115 is disposed on the first support bar 111 and the third support bar 113, to cover the accommodating cavity 116. The air deflector 115 is configured to guide a flow direction of air to enhance air diversion performed by the fan module, so that air is sucked from one side of the accommodating cavity 116 and exhausted from the other side of the accommodating cavity 116.

The air deflector 115 includes a front air deflector 1151 and a rear air deflector 1152. The front air deflector 1151 and the rear air deflector 1152 are disposed opposite to each other, and are respectively disposed on two sides of the accommodating cavity 116, to seal an opening of the accommodating cavity 116. An air intake vent 1153 relative to the fan 12 is disposed in a middle part of the front air deflector 1151. Air exhaust vents (not shown in the figure) are disposed on the rear air deflector 1152. The air intake vent 1153 is used for air to enter the accommodating cavity 116, and the air exhaust vents are used for air to flow out of the accommodating cavity 116.

In an embodiment, the fan 12 is a centrifugal fan. Air exhaust vents are disposed on the rear air deflector 1152 around an outer periphery of the fan 12. The centrifugal fan sucks air into the centrifugal fan along an axial direction of the centrifugal fan from a side that is of the front air deflector 1151 and that is away from the accommodating cavity 116 through the air intake vent 1153, and exhausts the air into the accommodating cavity 116 along a radial direction of the centrifugal fan. The air exhausted into the accommodating cavity 116 is exhausted from the accommodating cavity 116 through the air exhaust vents disposed on the rear air deflector 1152, and the plurality of air exhaust vents disposed along a circumferential direction enables the air to be evenly exhausted, so that the exhausted air is soft.

It may be understood that, in another embodiment, the fan 12 may alternatively be another type of fan, such as an axial flow fan or a rotary fan, and positions of the air exhaust vents on the rear air deflector 1152 may be adjusted based on a type of the fan. If the fan 12 is an axial flow fan, the positions of the air exhaust vents on the rear air deflector 1152 are opposite to a position of the air intake vent 1153.

In an embodiment, a plurality of avoidance holes 1154 are further disposed on the rear air deflector 1152 along a circumferential direction of the rear air deflector 1152. The avoidance holes 1154 may be disposed to avoid other elements disposed on the fan module 10, to prevent interference.

The fan module 10 further includes a mounting base 13. The mounting base 13 is disposed in the accommodating cavity 116. The fan 12 is disposed in the accommodating cavity 116 by using the mounting base 13.

In an embodiment, the mounting base 13 is disposed on two first support bars 111 close to the rear air deflector 1152. However, this imposes no limitation. The mounting base 13 may alternatively be disposed on the second support bar 112, the third support bar 113, the spacer plate 114, or even the rear air deflector 1152, provided that the fan 12 may be mounted in the accommodating cavity 116. The mounting base 13 is disposed to facilitate setting of a specific position of the fan 12 as required.

The fan rack 11 further includes a reinforcing structure 117. The reinforcing structure 117 is configured to reinforce mutual connections between the first support bar 111, the second support bar 112, the third support bar 113, the spacer plate 114, the air deflector 115, and the like, to prevent the connections of the fan rack 11 from being loosened or deformed due to vibration or the like during operation of the fan 12, causing the fan module 10 to break up.

In an embodiment, the reinforcing structure 117 includes a reinforcing bar and a reinforcing sheet. The reinforcing bar is connected to the first support bar 111 and another opposite first support bar 111, or is disposed on the air deflector 115. The reinforcing sheet is connected to the second support bar 112 and the third support bar 113.

The spacer plate 114 and the air deflector 115 are fixedly connected to the first support bar 111, the second support bar 112, and the third support bar 113 separately by using screws or the like.

Figure 4:
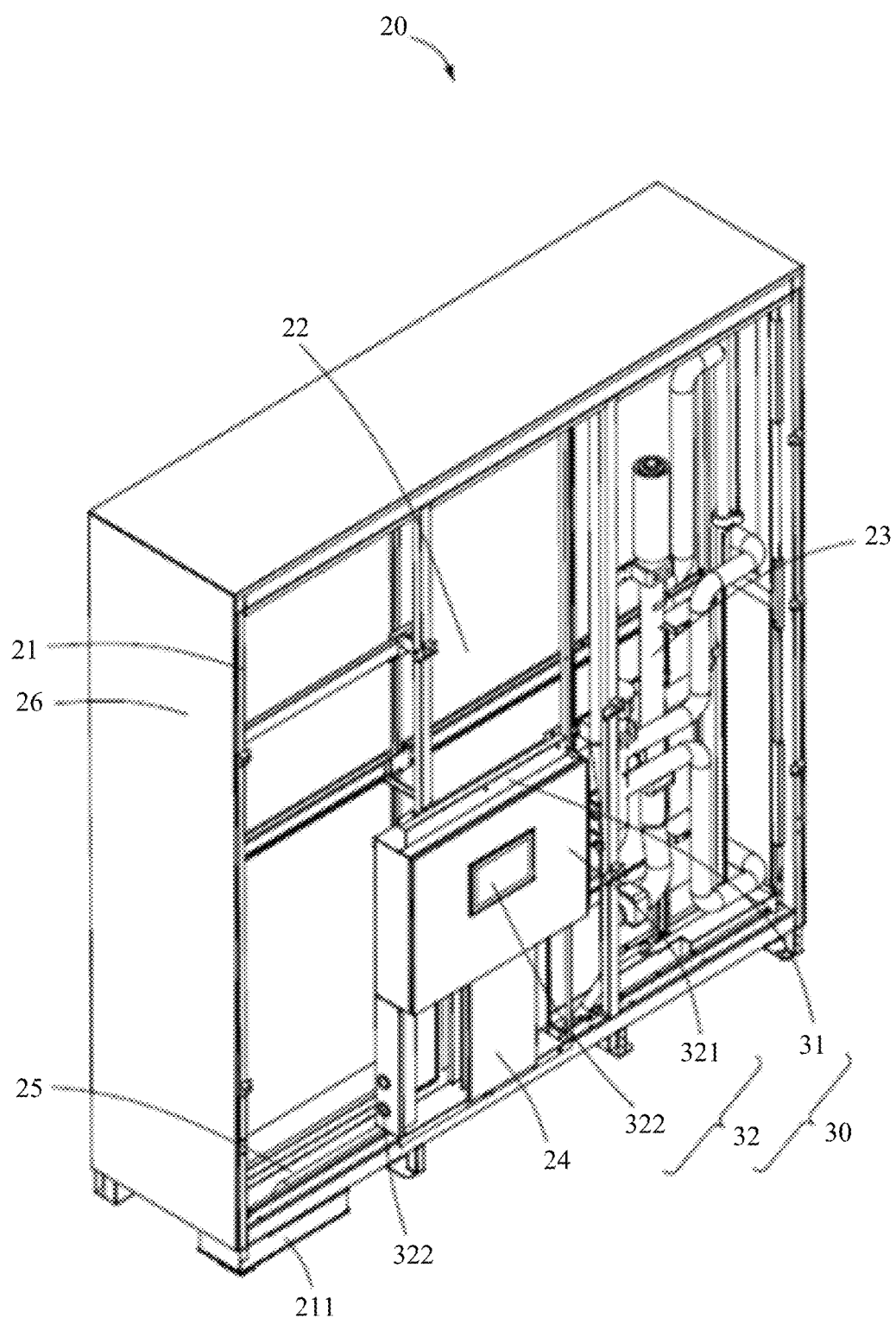
FIG. 4 is a schematic diagram of a heat exchanger module and an electric control module of the ventilation wall system shown in FIG. 1.

Refer to FIG. 4. The heat exchanger module 20 includes a heat exchanger frame 21, a heat exchanger 22, and a pipeline 23. The heat exchanger frame 21 is configured to place the heat exchanger 22 and configure the pipeline 23 connected to the heat exchanger 22. A cooling medium for heat exchange is circulated in the heat exchanger 22, and is used for heat exchange with air entering the heat exchanger module 20, to cool the air and exhaust the air from the other side. The pipeline 23 is used for flowing and circulation of the cooling medium.

The heat exchanger module 20 further includes a humidifier 24 and a water pan 25. The humidifier 24 and the water pan 25 are separately disposed on the heat exchanger frame 21. The humidifier 24 is configured to: when indoor relative humidity is relatively low, humidify dry hot air entering the heat exchanger module 20, to increase humidity of exhausted air, and enable humidity of indoor air to meet a requirement. The water pan 25 is a water container and is disposed at the bottom of the heat exchanger frame 21.

A protection plate 26 is disposed on an outer periphery of the heat exchanger frame 21 along a flow direction of air, to protect the heat exchanger 22 and restrict air flowing.

In an embodiment, openings on two sides of the heat exchanger frame 21 are consistent with openings on a side of the air intake vent 1153 and a side of the air exhaust vents of the fan rack 11, so that the fan rack 11 may be connected to either of the two sides of the heat exchanger frame 21. However, this imposes no limitation. A closed empty box, an empty box with openings at both ends, or the like may alternatively be added to the heat exchanger frame 21 or the fan rack 11, so that openings of the heat exchanger frame 21 or the fan rack 11 on which the empty box is disposed are consistent with the openings of the fan rack 11 or the heat exchanger frame 21.

It may be understood that a reinforcing structure 117 may be further disposed on the heat exchanger frame 21, to reinforce the heat exchanger frame 21.

The electric control module 30 includes a mounting rack 31 and an electric control box 32. The mounting rack 31 is disposed on the heat exchanger frame 21. The electric control box 32 is disposed on the mounting rack 31. The electric control box 32 is electrically connected to the fan 12, the heat exchanger 22, the humidifier 24, and the like separately, to control the fan 12, the heat exchanger 22, the humidifier 24, and the like. The mounting rack 31 is disposed to facilitate the electric control module 30 in adjusting, based on a structure of the heat exchanger module 20, a position at which the electric control module 30 is disposed.

The electric control box 32 includes a control system 321 and an interaction mechanism 322. A control circuit for controlling the ventilation wall system 100 is disposed in the control system 321. The control circuit is electrically connected to the fan 12, the heat exchanger 22, the humidifier 24, and the like separately. The interaction mechanism 322 is configured to perform human-computer interaction, so that an operator may freely select and control a working status of the ventilation wall system 100.

A related control program may be preset in the control system 321. If a heat amount in a place varies according to different time of each day, control programs for different time of each day may be preset to control different operating statuses based on different time of each day. If a local climate varies greatly in one year, control programs for different months may be preset to control operating statuses in different months, and so on.

The interaction mechanism 322 may include a touchscreen, a display, a button, a switch, and the like.

The air filter module 40 includes a filter rack 41 and an air filter 42. The air filter 42 is disposed on the filter rack 41.

A material of the air filter 42 is selected from nonwoven fabric, knitted cotton, an activated carbon filter material, a metal mesh, and the like.

When the ventilation wall system 100 is in the air supply mode, the filter rack 41 is disposed on the heat exchanger frame 21, and a side that is of the fan rack 11 and on which the air intake vent 1153 is disposed is disposed on the other side of the heat exchanger frame 21. A position that is on the filter rack 41 and that is relative to the electric control module 30 is vacant, and the air filter 42 is not disposed at the position, so that the operator can view and control the working status.

When the ventilation wall system 100 is in the air suction mode, the filter rack 41 is disposed on the side that is of the fan rack 11 and on which the air intake vent 1153 is disposed, and a side that is of the fan rack 11 and on which the air exhaust vents are disposed is connected to the heat exchanger frame 21.

The ventilation wall system further includes a flow equalizing frame 50. In the air suction mode, the flow equalizing frame 50 is disposed between the fan module 10 and the heat exchanger module 20. The flow equalizing frame 50 may increase a distance at which air is conveyed to the heat exchanger module by using the fan module, to equalize a flow of air exhausted from the fan module 10, so that an air volume of air entering the heat exchanger module 20 remains relatively even.

A maintenance window 51 is disposed on the flow equalizing frame 50 at a position close to the electric control module 30, and a maintenance door 52 is disposed on the maintenance window 51. The maintenance door 52 is disposed at the maintenance window 51 in a detachable or rotatable mode, so that when the electronic control module 30 needs to be viewed or controlled, an operation may be performed by using the maintenance window 51.

In some embodiments, the maintenance door 52 may be made of a transparent material, to facilitate observation of the electric control module 30.

The ventilation wall system 100 further includes a connecting mechanism 60. The connecting mechanism 60 is configured to connect the fan module 10, the heat exchanger module 20, the electric control module 30, and the air filter module 40.

The connecting mechanism 60 includes a corner piece 61 and a bolt 62. The mounting rack 31 is disposed on the heat exchanger frame 21 by using the bolt 62.

The corner piece 61 is disposed on the fan rack 11 of the fan module 10 and the heat exchanger frame 21 of the heat exchanger module 20. Corner pieces 61 are oppositely disposed on front and rear sides of both the fan rack 11 and the heat exchanger frame 21. The corner pieces 61 are disposed so that when the fan module 10 and the heat exchanger module 20 are installed, frames of the two modules may be basically brought together, to ensure that air does not flow out between the two modules.

When the ventilation wall system 100 is in the air supply mode, a side of the air intake vent 1153 of the fan rack 11 is connected to the heat exchanger frame 21 by using the corner piece 61, and is fastened by using the bolt 62. The filter rack 41 is fastened to a side that is of the heat exchanger frame 21 and that is away from the fan rack 11 by using the bolt 62.

When the ventilation wall system 100 is in the air suction mode, two sides of the flow equalizing frame 50 are respectively connected to an air exhaust vent side of the fan rack 11 and the heat exchanger frame 21 by using corner pieces 61. The filter rack 41 is fastened to a side that is of the fan rack 11 and that is away from the flow equalizing frame 50 by using the bolt 62.

It may be understood that a sealing ring may be further disposed on the fan rack 11 and the heat exchanger frame 21, to prevent air from flowing out from a connection point between the fan rack 11 and the heat exchanger frame 21.

The connecting mechanism 60 further includes a terminal fastener 63. The terminal fastener 63 is disposed on the heat exchanger frame 21. The fan 12 includes a wiring terminal.

The wiring terminal is mounted on the terminal fastener 63, to facilitate a plug connection, and implement an electrical connection to the electric control module 30.

In some embodiments, the electric control box 32 is electrically connected to the fan module 10 and the heat exchanger module 20 in a wiring manner. It may be understood that, in some embodiments, the electric control box 32 may alternatively be electrically connected to the fan module 10 and the heat exchanger module 20 in a wireless manner. Wireless communications units respectively disposed in the electric control module 30, the fan module 10, and the heat exchanger module 20 may transmit signals, so that a wiring setting problem does not need to be considered during assembly, and assembly convenience of the ventilation wall system 100 is further improved.

In an embodiment, the fan rack 11 and the heat exchanger frame 21 further include a foot cup 118 and a foot cup 211. There are four foot cups 118 and four foot cups 211. The four foot cups 118 are disposed in two rows on four corners at the bottom of the fan rack 11. The four foot cups 211 are disposed in two rows on four corners at the bottom of the heat exchanger frame 21. Openings are disposed on the foot cups 118 and the foot cups 211 to fasten the fan rack 11 and the heat exchanger frame 21 in a place.

It may be understood that, in some embodiments, a temperature sensing module, a humidity sensing module, and the like may be further disposed in the ventilation wall system 100. The temperature sensing module and the humidity sensing module are electrically connected to the electric control module 30, to display a temperature, humidity, and the like in the place by using the interaction mechanism 322 of the electric control module 30. Processing manners for cases such as an excessively high temperature, excessively high humidity, or excessively low humidity may be further preset in the control system 321 of the electric control module 30, to automatically adjust the working status of the ventilation wall system 100.

The temperature sensing module and the humidity sensing module may be as a whole, such as a temperature and humidity sensor, or may be two separate mechanisms. The temperature sensing module and the humidity sensing module may be separately disposed on the air filter module 40, to monitor a temperature of hot air entering the ventilation wall system 100. It may be understood that the temperature sensing module and the humidity sensing module may alternatively be disposed at other positions as required.

In the ventilation wall system 100 described in this application, modular processing is performed on the fan module 10, the heat exchanger module 20, the electric control module 30, and the air filter module 40, to facilitate production. Only connection, fastening, and wiring are needed for assembly, so that installation is convenient, and efficiency is improved. During assembly, a module installation sequence may be adjusted based on different requirements, to switch between the air supply mode and the air suction mode, thereby quickly implementing adjustment, and improving adaptability of the ventilation wall system 100. In addition, quantities and positions of the fan module 10 and the heat exchanger module 20 may be flexibly set based on different installation environments such as space and heat dissipation requirements, to maximize space utilization and meet the heat dissipation requirements. Modular setting enables any module to be quickly replaced and maintained.

An embodiment of this application further provides a data center. The data center may be configured to process data of commercial and operational organizations.

The data center includes, but is not limited to, a ventilation wall system 100, a database, a file server, an application server, middleware, and other mechanisms. The ventilation wall system 100 is the ventilation wall system 100 in the foregoing embodiment. The ventilation wall system 100 is configured to dissipate heat for the database, the file server, the application server, the middleware, and the other mechanisms.

The data center provided in this embodiment of this application has a same technical effect as the ventilation wall system 100 provided in the foregoing embodiment, and can meet a heat dissipation requirement of the data center.

The foregoing description is merely specific implementations of this application, but is not intended to limit the protection scope of this application. Any variation or replacement within the technical scope disclosed in this application shall fall within the protection scope of this application.

What is claimed is:

1. A ventilation wall system, having an air intake end for air entering and an air exhaust end for air exhausting, comprising:
a heat exchanger module configured to exchange heat for air entering the heat exchanger module;
a fan module configured to convey the air on one side of the fan module to an other side of the fan module;
an electric control module electrically connected to the fan module and the heat exchanger module;
an air filter module configured to filter the air entering the air intake end;
a connector configured to connect the fan module, the heat exchanger module, the electric control module, and the air filter module, and the connector comprises a corner piece and a fastener, the electric control module is disposed on the heat exchanger module using the fastener, the corner piece is disposed on the fan module and the heat exchanger module, and the fan module and the heat exchanger module are connected to each other using the corner piece, wherein
the ventilation wall system is configured to accept fan module installation at a plurality of different locations, the plurality of different locations comprising a first location of the ventilation wall system that is a side that is of the heat exchanger module and that is close to the air exhaust end, and a second location of the ventilation wall system that is a side that is of the heat exchanger module and that is close to the air intake end, and disposing the fan module at the first location causes air after heat exchange performed by the heat exchanger module to be sent out of the ventilation wall system using the fan module; and disposing the fan module at the second location causes air to be conveyed, using the fan module, to the heat exchanger module for heat exchange.

2. The ventilation wall system according to claim 1, wherein the fan module comprises a fan rack and a fan, an accommodating cavity is disposed on the fan rack, the fan is disposed in the accommodating cavity, and the fan is configured to suck air from one side of the accommodating cavity and exhaust the air from an other side of the accommodating cavity.

3. The ventilation wall system according to claim 2, wherein the fan rack comprises a first support bar, a second support bar, a third support bar, and a spacer plate; the first support bar, the second support bar, and the third support bar are disposed perpendicular to each other, and a plurality of spaces are separated on the fan rack; and the spacer plate is separately connected to the first support bar and the second support bar, or the second support bar and the third support bar, to isolate the plurality of separated spaces from each other to form the accommodating cavity.

4. The ventilation wall system according to claim 3, wherein the fan rack further comprises an air deflector, the air deflector is disposed on the first support bar and the third support bar, and the air deflector is configured to guide a flow direction of air sucked from one side of the accommodating cavity and exhausted from the other side of the accommodating cavity.

5. The ventilation wall system according to claim 4, wherein the air deflector comprises a front air deflector and a rear air deflector, and the front air deflector and the rear air deflector are disposed on two sides of the accommodating cavity; an air intake vent relative to the fan is disposed in a middle part of the front air deflector, and air exhaust vents are disposed on the rear air deflector.

6. The ventilation wall system according to claim 5, wherein the fan is a centrifugal fan, and the air exhaust vents are disposed along a circumferential direction of the rear air deflector.

7. The ventilation wall system according to claim 2, wherein the fan module further comprises a mounting base that is disposed in the accommodating cavity, and the fan is disposed in the accommodating cavity using the mounting base.

8. The ventilation wall system according to claim 1, wherein the heat exchanger module comprises a heat exchanger frame, a heat exchanger, and a pipeline, and the heat exchanger frame is configured to place the heat exchanger and configure the pipeline connected to the heat exchanger.

9. The ventilation wall system according to claim 8, wherein the electric control module comprises a mounting rack and an electric control box, the mounting rack is disposed on the heat exchanger frame, the electric control box is disposed on the mounting rack, and the electric control box is electrically connected to the fan module and the heat exchanger separately.

10. The ventilation wall system according to claim 1, wherein the fastener comprises a bolt.

11. The ventilation wall system according to claim 1, wherein the ventilation wall system further comprises a flow equalizing frame disposed between the fan module and the heat exchanger module to increase a distance at which air is conveyed to the heat exchanger module using the fan module.

12. A data center, comprising:
a ventilation wall system that comprises an air intake end for air entering the ventilation wall system and an air exhaust end for air exhausting from the ventilation wall system, wherein the ventilation wall system further comprises a heat exchanger module to exchange heat for air entering the heat exchanger module, and wherein the ventilation wall system further comprises:
a fan module configured to convey the air on one side of the fan module to an other side of the fan module;
an electric control module electrically connected to the fan module and the heat exchanger module; and
an air filter module configured to filter the air entering the air intake end;
a connector configured to connect the fan module, the heat exchanger module, the electric control module, and the air filter module, and the connector comprises a corner piece and a fastener, the electric control module is disposed on the heat exchanger module using the fastener, the corner piece is disposed on the fan module and the heat exchanger module, and the fan module and the heat exchanger module are connected to each other using the corner piece, wherein
the ventilation wall system is configured to accept fan module installation at a plurality of different locations, the plurality of different locations comprising a first location of the ventilation wall system that is a side that is of the heat exchanger module and that is close to the air exhaust end, and a second location of the ventilation wall system that is a side that is of the heat exchanger module and that is close to the air intake end, and disposing the fan module at the first location causes air after heat exchange performed by the heat exchanger module to be sent out of the ventilation wall system using the fan module; and disposing the fan module at the second location causes air to be conveyed, using the fan module, to the heat exchanger module for heat exchange.

13. The data center according to claim 12, wherein the fan module comprises a fan rack and a fan, an accommodating cavity is disposed on the fan rack, the fan is disposed in the accommodating cavity, and the fan is configured to suck air from one side of the accommodating cavity and exhaust the air from an other side of the accommodating cavity.

14. The data center according to claim 13, wherein the fan rack comprises a first support bar, a second support bar, a third support bar, and a spacer plate; the first support bar, the second support bar, and the third support bar are disposed perpendicular to each other, and a plurality of spaces are separated on the fan rack; and the spacer plate is separately connected to the first support bar and the second support bar, or the second support bar and the third support bar, to isolate the plurality of separated spaces from each other to form the accommodating cavity.

15. The data center according to claim 14, wherein the fan rack further comprises an air deflector, the air deflector is disposed on the first support bar and the third support bar, and the air deflector is configured to guide a flow direction of air sucked from one side of the accommodating cavity and exhausted from the other side of the accommodating cavity.

16. The data center according to claim 15, wherein the air deflector comprises a front air deflector and a rear air deflector, and the front air deflector and the rear air deflector are disposed on two sides of the accommodating cavity; an air intake vent relative to the fan is disposed in a middle part of the front air deflector, and air exhaust vents are disposed on the rear air deflector.

17. The data center according to claim 16, wherein the fan is a centrifugal fan, and the air exhaust vents are disposed along a circumferential direction of the rear air deflector.

18. The data center according to claim 13, wherein the fan module further comprises a mounting base that is disposed in the accommodating cavity, and the fan is disposed in the accommodating cavity using the mounting base.

19. The data center according to claim 12, wherein the heat exchanger module comprises a heat exchanger frame, a heat exchanger, and a pipeline, and the heat exchanger frame is configured to place the heat exchanger and configure the pipeline connected to the heat exchanger.

* * * * *